United States Patent
Lin et al.

(10) Patent No.: US 7,170,775 B2
(45) Date of Patent: Jan. 30, 2007

(54) MRAM CELL WITH REDUCED WRITE CURRENT

(75) Inventors: Wen Chin Lin, Hsin-Chu (TW); Denny D. Tang, Saratoga, CA (US); Li-Shyue Lai, Jhube (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 113 days.

(21) Appl. No.: 11/030,453

(22) Filed: Jan. 6, 2005

(65) Prior Publication Data

US 2006/0146602 A1 Jul. 6, 2006

(51) Int. Cl.
G11C 11/00 (2006.01)

(52) U.S. Cl. .................. 365/158; 365/171; 365/173

(58) Field of Classification Search ............ 365/158 O, 365/171 X, 173 X
See application file for complete search history.

(56) References Cited

U.S. PATENT DOCUMENTS

| | | | |
|---|---|---|---|
| 6,005,800 A | 12/1999 | Koch et al. | |
| 6,114,719 A | 9/2000 | Dill et al. | |
| 6,335,890 B1 | 1/2002 | Reohr et al. | |
| 6,490,217 B1 | 12/2002 | DeBrosse et al. | |
| 6,509,621 B2 | 1/2003 | Nakao | |
| 6,515,897 B1 | 2/2003 | Monsma et al. | |
| 6,522,579 B2 | 2/2003 | Hoenigschmid | |
| 6,567,299 B2 | 5/2003 | Kunikiyo et al. | |
| 6,590,803 B2 | 7/2003 | Saito et al. | |
| 6,594,191 B2 | 7/2003 | Lammers et al. | |
| 6,621,731 B2 | 9/2003 | Bessho et al. | |
| 6,661,689 B2 | 12/2003 | Asao et al. | |
| 6,693,822 B2 | 2/2004 | Ito | |
| 6,693,826 B1 | 2/2004 | Black, Jr. et al. | |
| 6,711,053 B1 * | 3/2004 | Tang ........................ | 365/158 |
| 6,809,958 B2 * | 10/2004 | Bloomquist et al. ........ | 365/158 |
| 6,909,631 B2 * | 6/2005 | Durlam et al. ............. | 365/158 |
| 6,917,087 B2 * | 7/2005 | Chen ........................ | 257/421 |
| 6,992,918 B2 * | 1/2006 | Li et al. .................... | 365/158 |
| 7,016,222 B2 * | 3/2006 | Morikawa .................. | 365/158 |
| 7,057,253 B2 * | 6/2006 | Braun ....................... | 257/438 |
| 2002/0105827 A1 | 8/2002 | Redon et al. | |
| 2003/0048676 A1 | 3/2003 | Daughton et al. | |
| 2003/0086313 A1 | 5/2003 | Asao | |

OTHER PUBLICATIONS

F. Montaigne, et al., "Enhanced Tunnel Magnetoresistance At High Bias Voltage In Double-Barrier Planar Junctions", Applied Physics Letters, vol. 73, No. 19, Nov. 9, 1998, pp. 2829-2831.

Yoshiaki Saito et al., "Correlation Between Barrier Width, Barrier Height, and DC Bias Voltage Dependences on the Magnetoresistance Ratio in Ir-Mn Exchange Biased Single and Double Tunnel Junctions", The Japan Society of Applied Physics, Jpn. J. Appl. Phys. vol. 39 (2000) pp. L1035-L1038, Part 2, No. 10B, Oct. 15, 2000.

* cited by examiner

*Primary Examiner*—VanThu Nguyen
(74) *Attorney, Agent, or Firm*—Haynes and Boone, LLP

(57) ABSTRACT

A magnetic random access memory (MRAM) cell that includes an MRAM stack and a conductive line for carrying write current associated with the MRAM cell. The conductive line is oriented in a direction that is angularly offset from an easy axis of the MRAM stack by an acute angle, such as about 45 degrees.

14 Claims, 5 Drawing Sheets

MRAM CELL WITH REDUCED WRITE CURRENT

CROSS-REFERENCE

This application is related to the following commonly-assigned U.S. Patent Applications, the entire disclosures of which are hereby incorporated herein by reference:

"MULTI-SENSING LEVEL MRAM STRUCTURES," application Ser. No. 10/685,824, filed Oct. 13, 2003, having Wen Chin Lin and Denny D. Tang named as inventors.

"MULTI-SENSING LEVEL MRAM STRUCTURE WITH DIFFERENT MAGNETO-RESISTANCE RATIOS," application Ser. No. 10/678,699, filed Oct. 3, 2003, having Wen Chin Lin and Denny D. Tang named as inventors.

"NON-ORTHOGONAL WRITE LINE STRUCTURE IN MRAM," Application Ser. No. 10/827,079, having Wen Chin Lin, Denny D. Tang and Li-Shyue Lai named as inventors.

BACKGROUND

Magnetic random access memory (MRAM) cells are often based on a magnetic tunnel junction (MTJ) cell comprising at least three basic layers: a "free" ferromagnetic layer, an insulating tunneling barrier, and a "pinned" ferromagnetic layer. In the free layer, magnetization moments are free to rotate under an external magnetic field, but the magnetic moments in the "pinned" layer are not. The pinned layer may comprise a ferromagnetic material and/or an anti-ferromagnetic material which "pins" the magnetic moments in the ferromagnetic layer. A thin insulation layer forms a tunneling barrier between the pinned and free magnetic layers.

In order to sense states in the MTJ configuration, a constant current can be applied through the cell. As the magneto-resistance varies according to the state stored in the cell, the voltage over the memory cell can be sensed. To write or change the state in the memory cell, an external magnetic field can be applied that is sufficient to completely switch the direction of the magnetic moments of the free magnetic layer.

A Tunneling Magneto-Resistance (TMR) effect is often utilized in conventional MTJ configurations. The TMR effect allows magnetic moments to switch directions in a magnetic layer in response to exposure to an external magnetic field. By utilizing the TMR effect, the magneto-resistance (MR) of an MTJ configuration may be altered. MR is a measure of the ease with which electrons may flow through the free layer, the tunneling barrier, and the pinned layer. A minimum MR occurs in an MTJ configuration when the magnetic moments in both magnetic layers have the same direction or are "parallel." A maximum MR occurs when the magnetic moments of both magnetic layers are in opposite directions or are "anti-parallel."

MRAM cells typically include a write line that is perpendicular to the hard (short) axis of the free layer. An electrical current is introduced to the write line to create the magnetic field necessary to change the direction of the free layer magnetization. However, the parallel alignment of the write line and hard axis of the free layer requires one of the highest amplitudes of magnetization (Hc) to change the direction of the free layer magnetization when considering all possible orientations of the write line relative to the hard axis of the free layer. Consequently, such an orientation also requires the highest write current levels.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
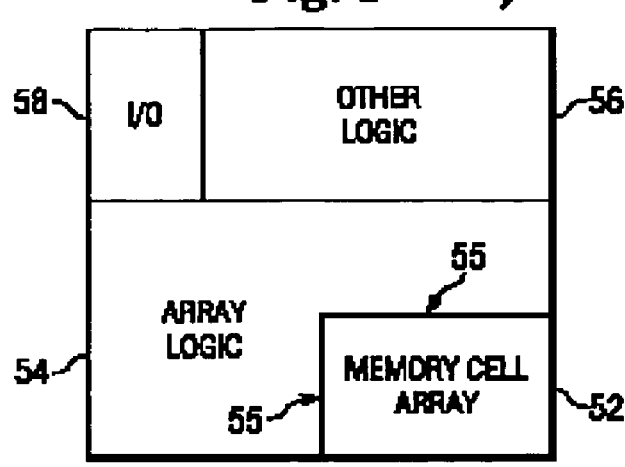
FIG. 1 is a block diagram of one embodiment of an integrated circuit device having a memory cell array according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a block diagram of one embodiment of an integrated circuit 50 that is one example of a circuit that can benefit from aspects of the present disclosure. The integrated circuit 50 includes a memory cell array 52 that can be controlled by an array logic 54 through an interface 55. It is well known in the art that various logic circuitry, such as row and column decoders and sense amplifiers, can be included in the array logic 54, and that the interface 55 may include one or more bit lines, gate lines, digit lines, control lines, word lines, and other communication paths to interconnect the memory cell array 52 with the array logic 54. These communication paths will hereinafter be referred to as bit lines or word lines, it being understood that different applications of the present disclosure may use different communication paths. The integrated circuit can further include other logic 56 such as counters, clock circuits, and processing circuits, and input/output circuitry 58 such as buffers and drivers.

Figure 2:
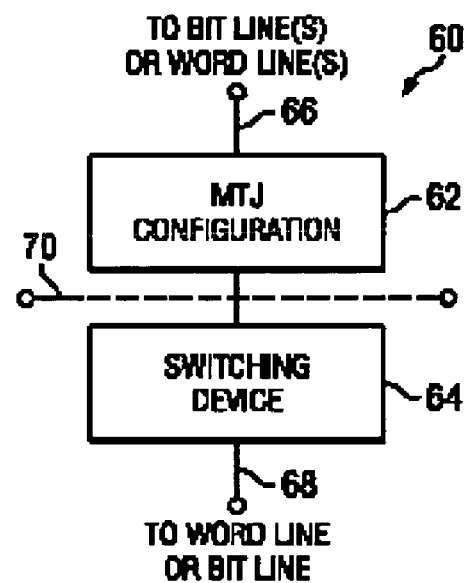
FIG. 2 is a block diagram of one embodiment of a memory cell for use in the memory cell array shown in FIG. 1 according to aspects of the present disclosure.

Referring to FIG. 2, the memory cell array 52 of FIG. 1 may include one or more magnetic random access memory (MRAM) cells 60. Each MRAM cell 60 does not need to be commonly configured, but for the sake of example, can be generically described as including a configuration of MTJ devices 62 and a switching device 64. Examples of various embodiments of the MTJ devices 62 are discussed in further detail below, and examples of the switching device 64 include a metal oxide semiconductor (MOS) transistor, an MOS diode, and/or a bipolar transistor. The memory cell 60 can store 1, 2, 3, 4 or more bits, but for the sake of further example, a two bit configuration will be discussed. Also, the present disclosure is applicable and/or readily adaptable to single and double junction MTJ devices with different MR ratios, where there can be four magneto-resistance levels. The different MR ratios may facilitate the capability of sensing at least four levels of magneto-resistance, and the capacity to store at least two bits.

The MRAM cell 60 may include three terminals, a first terminal 66, a second terminal 68, and a third terminal 70. For the sake of example, the first terminal 66 is connected to one or more bit lines and produces an output voltage in a read operation, which is provided to the bit line(s). The second terminal 68 is connected to one or more word lines, which can activate the cell 60 for a read or write operation. The third terminal 70 may be proximate a control line, such as a gate or digit line, and can provide a current for producing a magnetic field to effect the MTJ configuration 62. It is understood that the arrangement of bit lines, word lines, control lines, and other communication signals can vary for different circuit designs, and the present discussion is only providing one example of such an arrangement.

Figure 3:
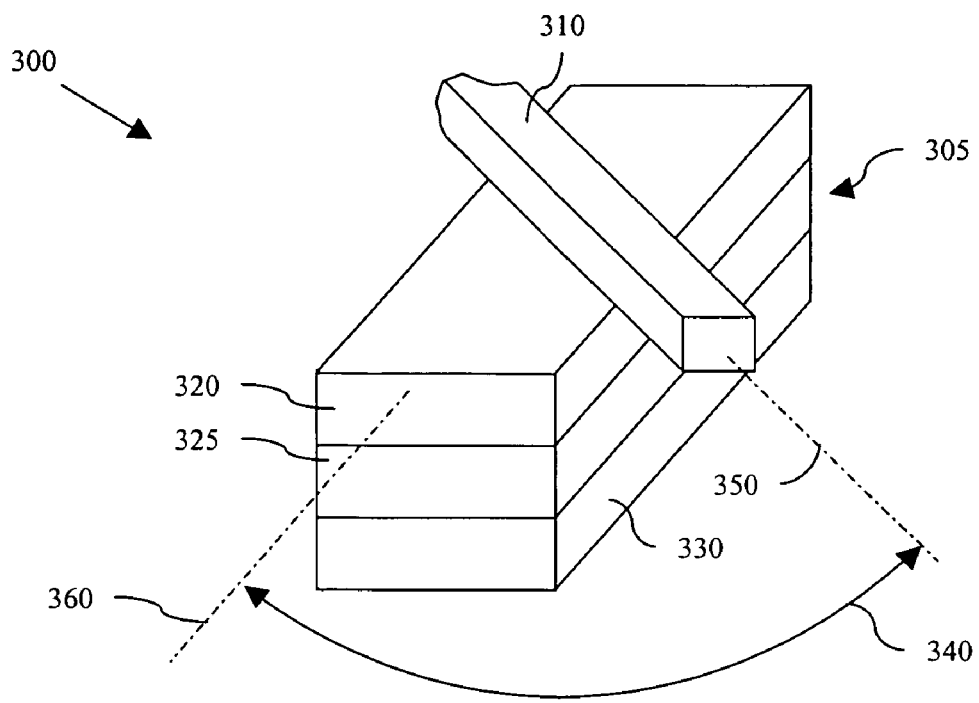
FIG. 3 is a perspective view of one embodiment of a portion of a magnetic random access memory (MRAM) cell constructed according to aspects of the present disclosure.

Referring to FIG. 3, illustrated is a perspective view of at least a portion of one embodiment of an MRAM cell 300 constructed according to aspects of the present disclosure. The elements of the MRAM cell 300 that are shown in FIG. 3 include a write line 310 passing over an MRAM stack 305. The MRAM stack 305 includes a free layer 320 located near or adjacent the write line 310, a tunneling barrier layer 325 adjacent the free layer 320, and a pinned layer 330 located adjacent the tunneling barrier layer 325 and distal from the write line 310. However, in other embodiments, the pinned layer 330 may located near or adjacent the write line 310, and the free layer may be located distal from the write line 310 (e.g., the locations of the free layer 320 and the pinned layer 330 may be switched). The MRAM stack 305 has a long axis 360, which maybe referred to as its easy axis. The write line 310 also has a long axis 350.

The write line axis 350 and the MRAM stack easy axis 360 are angularly offset by an angle 340, at least within a region of intersection between normal projections of the perimeters or footprints of the MRAM stack 305 and the write line 310. The offset angle 340 is an acute angle ranging between 0 degrees and 90 degrees, exclusively. That is, the offset angle 340 does not equal 0 degrees or 90 degrees. In one embodiment, the offset angle 340 ranges between about 45 and about 90 degrees, exclusively. In another embodiment, the offset angle 340 ranges between about 15 degrees and about 75 degrees, inclusively. In another embodiment, the offset angle 340 is about 45 degrees.

Figure 4:
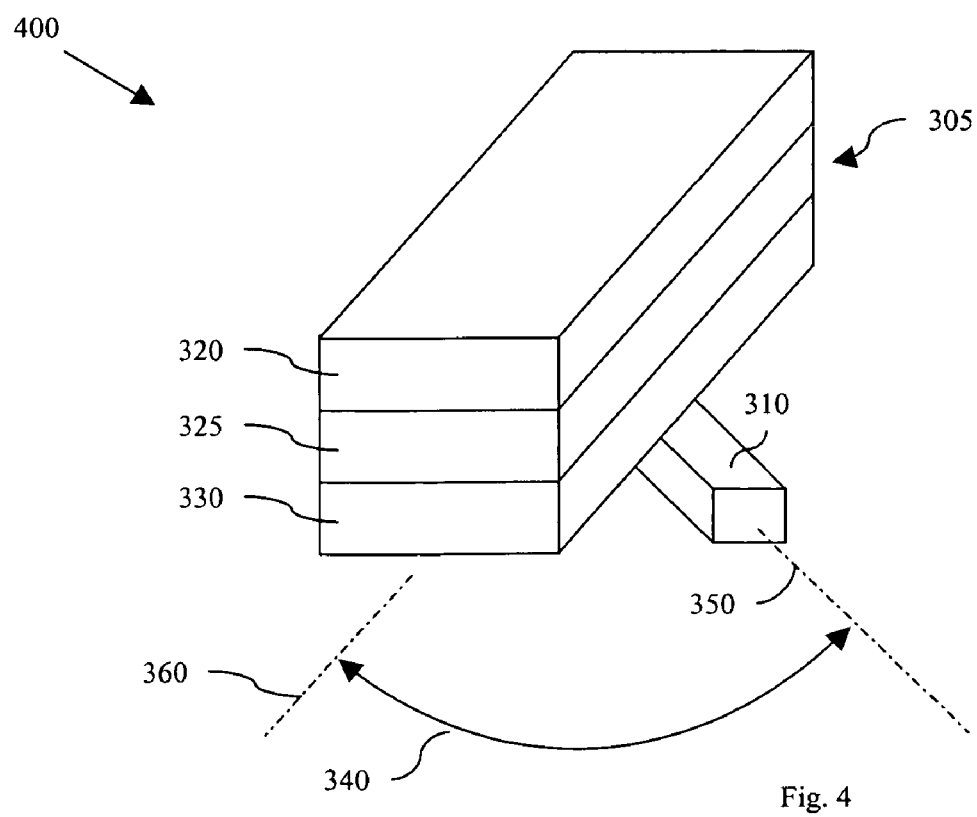
FIG. 4 is a perspective view of another embodiment of a portion of a magnetic random access memory (MRAM) cell constructed according to aspects of the present disclosure.

Referring to FIG. 4, illustrated is a perspective view of a portion of another embodiment of the MRAM cell 300 shown in FIG. 3, herein designated by the reference numeral 400. The MRAM cell 400 is substantially similar to the MRAM cell 300, such that include the write line 310 and the MRAM stack 305, wherein the write line axis 350 and the MRAM stack easy axis 360 are angularly offset by angle 340. However, in the embodiment shown in FIG. 4, the MRAM stack 305 is located over the write line 310, in contrast to the write lines 310 being located over the MRAM stack 305 as shown in FIG. 3. As with the MRAM cell 300 shown in FIG. 3, the write line 310 of the MRAM cell 400 may be adjacent or located closer to either the pinned layer 330 or the free layer 320. In other words, FIGS. 3 and 4 demonstrate that, among other things, the write line 310 may pass over or under the MRAM stack 305 (e.g., relative to a substrate over which the write line 310 and MRAM stack 305 are located), and in each such embodiment the pinned layer 330 may be located over or under the free layer 320.

Figure 5:
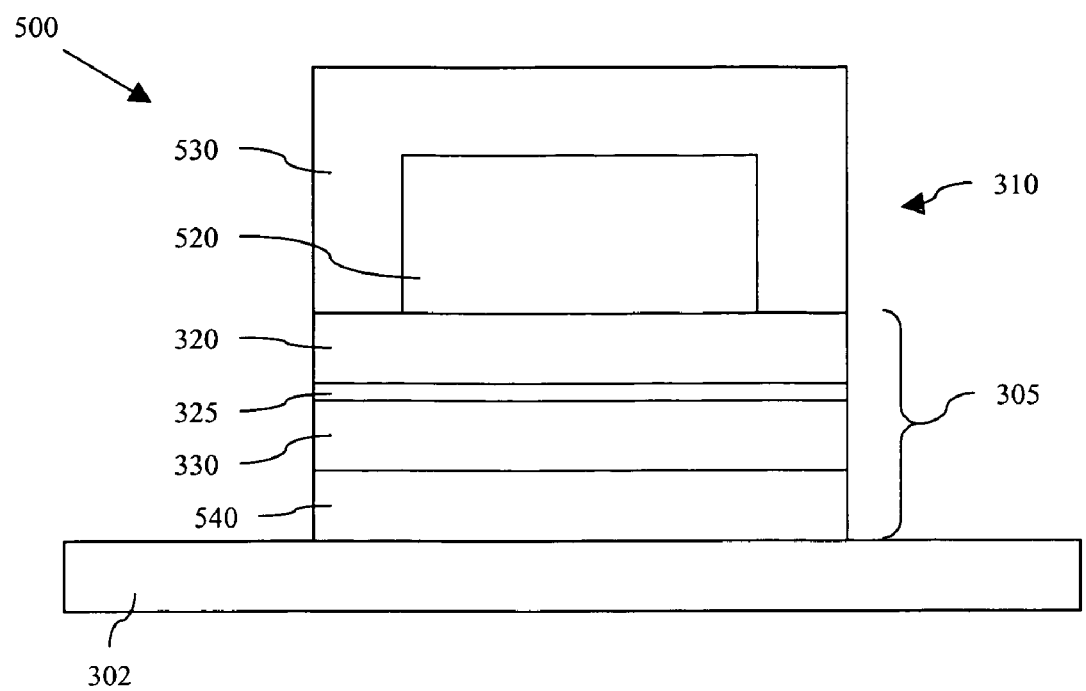
FIG. 5 is a sectional view of the MRAM cell shown in FIG. 3.

Referring to FIG. 5, illustrated is a sectional view of one embodiment of the MRAM cell 300 shown in FIG. 3, herein designated by the reference numeral 500. As shown in FIG. 5, the write line 310 may comprise a bulk conductor 520 and a cladding layer 530.

The pinned layer 330 may comprise a ferromagnetic material wherein magnetic dipoles and moments are magnetically "pinned." For example, an adjacent or proximate pinning layer may comprise an anti-ferromagnetic layer or an anti-ferromagnetic exchange layer. In one embodiment, the pinned layer 330 comprises NiFe, NiFeCo, CoFe, Fe, Co, Ni, alloys or compounds thereof, and/or other ferromagnetic materials. The pinned layer 330 may also comprise a plurality of layers. For example, the pinned layer 330 may comprise a Ru spacer layer interposing two or more ferromagnetic layers. Thus, the pinned layer 330 may be or comprise a synthetic anti-ferromagnetic (SAF) layer. The pinned layer 330 may be formed by chemical-vapor deposition (CVD), plasma-enhanced CVD (PECVD), atomic layer deposition (ALD), physical-vapor deposition (PVD), electrochemical deposition, molecular manipulation, and/or other processes.

The tunneling barrier 325 may comprise $SiO_x$, $SiN_x$, $SiO_xN_y$, $AlO_x$, $TaO_x$, $TiO_x$, $AlN_x$, and/or other non-conductive materials. In one embodiment, the tunneling barrier 325 may be formed by CVD, PECVD, ALD, PVD, electro-chemical deposition, molecular manipulation, and/or other processes. The tunneling barrier 325 may electrically insulate and/or physically separate the pinned layer 330 from the free layer 320 independently or in conjunction with other layers interposing the pinned and free layers 330, 320.

The free layer 320 may be substantially similar in composition and manufacture to the pinned layer 330. For example, the free layer 320 may comprise NiFe, NiFeCo, CoFe, Fe, Co, Ni, alloys/compounds thereof, and/or other ferromagnetic materials, and may be formed by CVD, PECVD, ALD, PVD, electro-chemical deposition, molecular manipulation, and/or other processes. However, the free layer 320 may not be adjacent an antiferromagnetic material, such that the free layer 320 may not be pinned. For example, the magnetic dipoles in the free layer 320 may be aligned in more than one direction. In one embodiment, the free layer 320 comprises a plurality of layers, such as a Ru spacer layer interposing two or more ferromagnetic layers. Thus, the free layer 320 may also be or comprise an SAF layer.

As discussed above, the locations of the free layer 320 and the pinned layer 330 relative to the tunneling barrier 325 may be switched. For example, the MRAM stack 305 may include the free layer 320 located over a substrate 302, the tunneling barrier layer 325 located over the free layer 320, and the pinned layer 330 located over the tunneling barrier layer 325, in contrast to the embodiment shown in FIG. 5.

The substrate 302 may comprise silicon, gallium arsenide, gallium nitride, strained silicon, silicon germanium, silicon carbide, carbide, diamond, and/or other materials. In one embodiment, the substrate 302 comprises a silicon-on-insulator (SOI) substrate, such as a silicon-on-sapphire substrate, a silicon germanium-on-insulator substrate, or another substrate comprising an epitaxial or otherwise formed semiconductor layer on an insulator layer. The substrate 302 may also or alternatively comprise a fully depleted SOI substrate, possibly having an active layer thickness ranging between about 5 nm and about 200 nm. The substrate 302 may also or alternatively comprise an air gap, such as may be formed in a "silicon-on-nothing" (SON) structure. Moreover, features other than or in addition to those shown may interpose the pinned layer 330 and the substrate 302, such as one or more conductive features and/or dielectric layers.

The write line 310 may be an electrically conductive bit-line, word-line, program-line, and/or digit-line in a memory cell array or other integrated circuit and, as described above, may include the bulk conductor 520 and the cladding layer 530. The bulk conductor 520 may be formed by CVD, PECVD, ALD, PVD, electrochemical deposition, molecular manipulation, and/or other processes, and may comprise Cu, Al, Ag, Au, W, alloys/compounds thereof, and/or other materials. The bulk conductor 520 may also include a barrier layer comprising Ti, Ta, TiN, TaN, WN, SiC, and/or other materials.

The cladding layer 530 surrounds a substantial portion of the perimeter of the bulk conductor 520. For example, in the illustrated embodiment, the bulk conductor 520 has a four-sided perimeter and the cladding layer 530 surrounds or covers three of the four sides of the bulk conductor 520 perimeter. In other embodiments, the cladding layer 530 may substantially encompass the perimeter of the bulk conductor 520.

The cladding layer 530 may be substantially similar in composition and manufacture to the free layer 320. For example, the cladding layer 530 may comprise NiFe, NiFeCo, CoFe, Fe, Co, Ni, alloys/compounds thereof, and/or other ferromagnetic materials, and may be formed by CVD, PECVD, ALD, PVD, electro-chemical deposition, molecular manipulation, and/or other processes.

Figure 6:
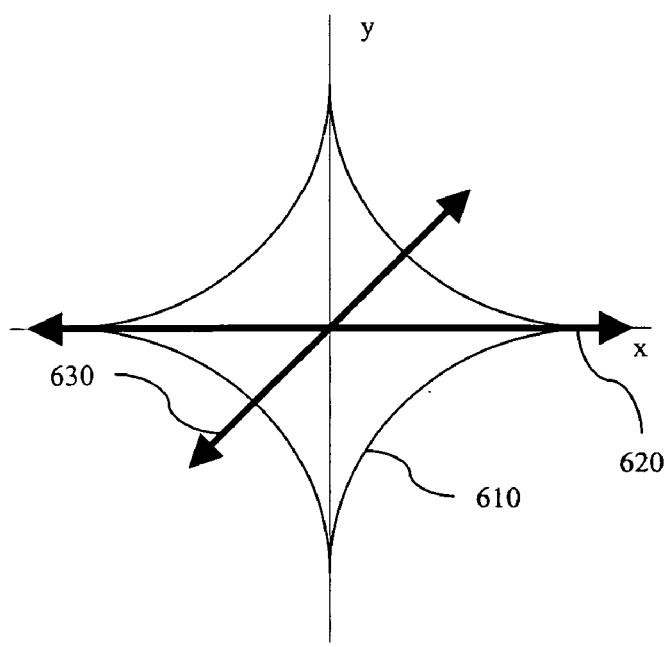
FIG. 6 is an asteroid curve demonstrating aspects of the present disclosure.

Referring to FIG. 6, illustrated is a graph depicting an asteroid curve 610 demonstrating aspects of the present disclosure. In general, asteroid curves corresponding to MRAM cells may represent the magnitude of the magnetic field resulting when one or more currents are applied to the MRAM cell. The magnetic field may be generated by current flow through bit, word, program, and/or digit lines connected to or passing near the MRAM cell. In FIG. 6, the easy axis is parallel to the x-axis of the graph. Magnetization reversal can occur when the distal end of a vector representing an applied magnetic field extends outside the asteroid curve. Thus, if the magnetic field applied to the MRAM cell is substantially parallel to the MRAM cell easy axis, such as in a two-transistor, one-MTJ (2T1MTJ) configuration, the magnitude of the magnetic field required for magnetization reversal is represented by the vector 620.

However, if the magnetic field applied to the MRAM cell is substantially non-parallel to the MRAM cell easy axis, as in embodiments shown in FIGS. 3 and 4, the magnitude of the magnetic field required for magnetization reversal may be decreased. Such an example is represented in FIG. 6 by the vector 630. Thus, an angular offset between the applied magnetic field and the MRAM cell easy axis can decrease the magnitude of the magnetic field required for magnetization reversal. In the embodiment represented by the vector 630, the angular offset is about 45 degrees, although other angular offsets are within the scope of the present disclosure.

Moreover, the decreased magnitude of the magnetic field required for magnetization reversal can provide a larger margin of the applied magnetic field relative to the required magnetic field, and also decreases the amount of current required to generate the magnetic field. Thus, the threshold of the magnetic field magnitude required for magnetization reversal can be decreased. Furthermore, the above-described aspects of angularly offsetting the write line and MRAM cell easy axis can be employed in a 2T1MTJ configuration, such that little or no disturbance may be encountered from neighboring cells or conductive lines. Consequently, the angular offset employed to increase margin and decrease writing threshold and current may not generate disturbance with neighboring cells.

Figure 7:
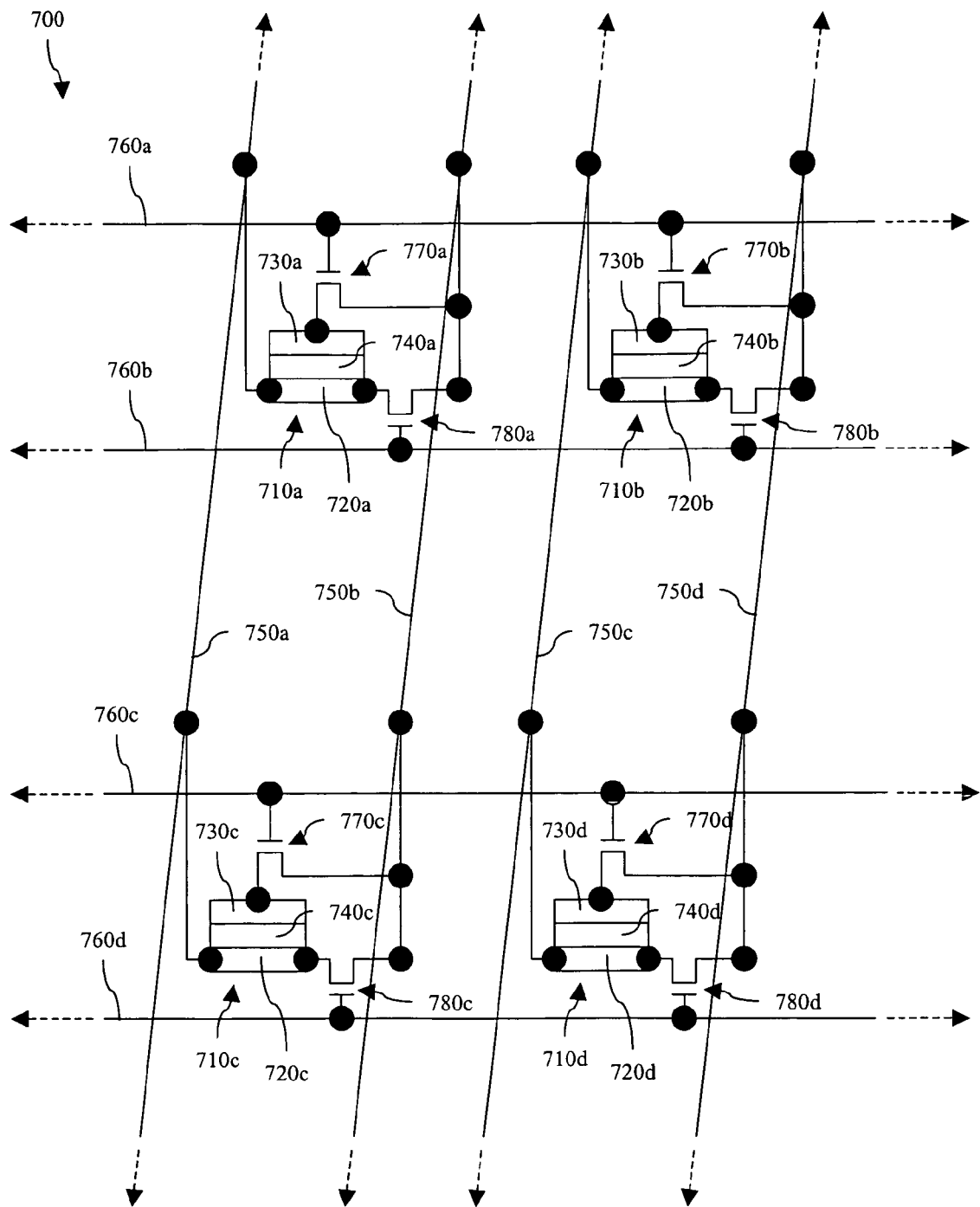
FIG. 7 is a circuit diagram of one embodiment of an integrated circuit device constructed according to aspects of the present disclosure.

Referring to FIG. 7, illustrated is a circuit diagram of an embodiment of an integrated circuit device 700 constructed according to aspects of the present disclosure. The integrated circuit device 700 includes a plurality of MRAM cells 710a–d, ones of which may be substantially similar to the MRAM cells 300, 400, 500 shown in FIGS. 3–5, respectively. The MRAM cells 710a–d may include MRAM stacks comprising first terminals 720a–d, second terminals 730a–d, and interposing structure 740a–d. Each of the first terminals 720a–d may be or comprise a free layer, wherein each of the second terminals 730a–d may be or comprise a pinned layer. Alternatively, each of the first terminals 720a–d may be or comprise a pinned layer, wherein each of the second terminals 730a–d may be or comprise a free layer. In each such embodiment, either or both of the free and pinned layers may comprise an SAF layer. The interposing structure 740a–d may also be or comprise one or more tunneling barrier layers.

The integrated circuit device 700 may also include bit and bit-bar lines 750a–d and word and word-bar lines 760a–d interconnecting ones of the MRAM cells 710a–d. For example, in the illustrated embodiment, the bit line 750a interconnects the first terminals 720a, 720c of the MRAM cells 710a, 710c, respectively. One or more of the bit and bit-bar lines 750a–d and word and word-bar lines 760a–d may pass a corresponding one of the MRAM cells 710a–d at an acute angle, as in embodiments described above.

The integrated circuit device 700 may also include transistors 770a–d and transistors 780a–d. The integrated circuit device 700 may be or comprise a 2T1MTJ device, wherein the MRAM cells 710a–710d may each comprise two transistors (e.g., one each of the transistors 770a–d, 780a–d) and one MRAM stack. For example, the MRAM cell 710a includes the transistor 770a coupled between the second terminal 730a and the bit-bar line 750b, wherein the gate of the first transistor 770a is coupled to the word line 760a, and also includes the transistor 780a coupled between the first terminal 720a and the bit-bar line 750b, wherein the gate of the transistor 780a is coupled to the word-bar line 760b. In one embodiment of operation, "writing" to the cell 710a comprises selecting the word-bar line 760b, applying a write-current to the bit line 750a, and grounding the bit-bar line 750b. Similarly, "reading" the cell 710a may comprise selecting the word line 760a, applying a read-current to the bit line 750*a*, grounding the bit-bar line 750*b*, and sensing the voltage on the bit line 750*a*. Of course, one or more of the other bit lines and word lines may also be grounded during the writing and/or reading operations, as well as other interconnections not described herein.

Figure 8:
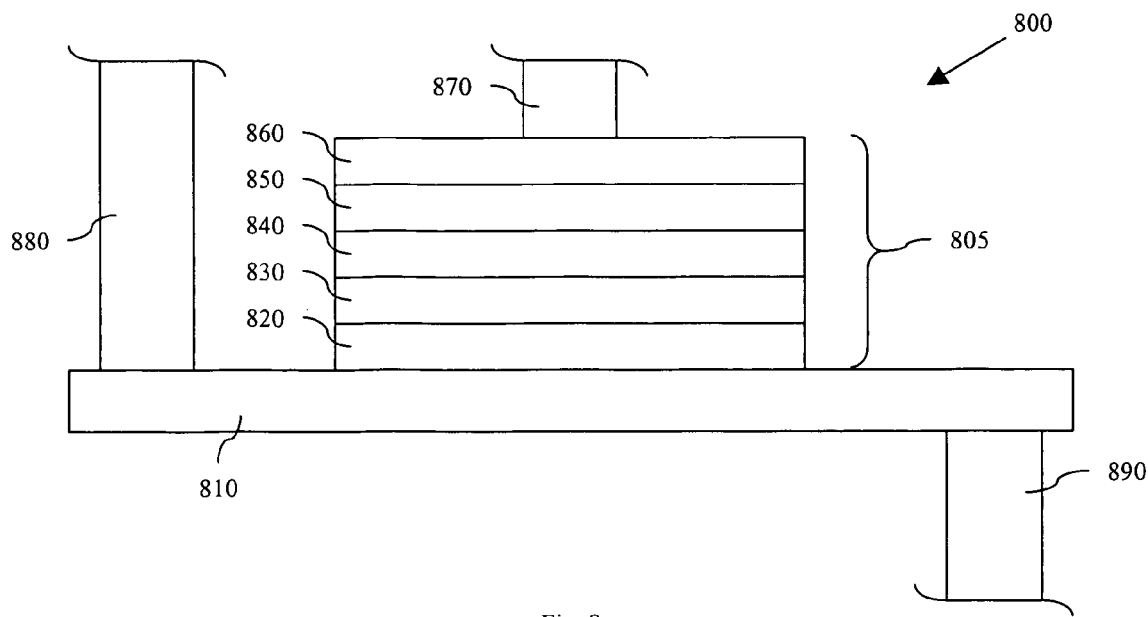
FIG. 8 is a sectional view of one embodiment of a memory cell that may be employed in the integrated circuit device shown in FIG. 7.

Referring to FIG. 8, illustrated is a sectional view of another embodiment of an MRAM cell 800 according to aspects of the present disclosure, and which may be employed in the integrated circuit 700 shown in FIG. 7. The MRAM cell 800 includes an electrode 810 passing under (or over in other embodiments) an adjacent or proximate MRAM stack 805. The MRAM stack 805 includes an anti-ferromagnetic or other pinning layer 820, and also includes a pinned layer 830 on or over the pinning layer 820. An aluminum oxide or other tunneling barrier layer 840 is located on or over the pinned layer 830, and a free layer 850 is located on or over the tunneling barrier layer 840. An electrode 860 is located on or over the free layer 850 and is contacted by a via 870. Another via 880 contacts the electrode 810, and yet another via 890 extends away from the electrode 810 opposite the via 880.

Figure 9:
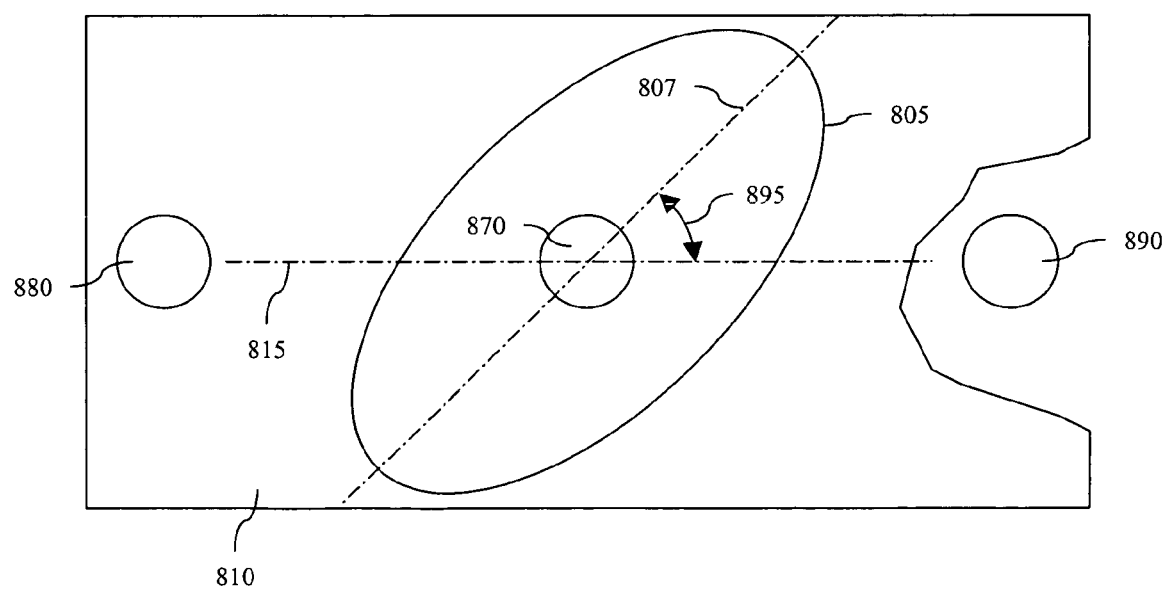
FIG. 9 is a plan view of the memory cell shown in FIG. 8.

Referring to FIG. 9, illustrated is a plan view of the MRAM cell 800 shown in FIG. 8. The easy axis 807 of the MRAM stack 805 is angularly offset from the long axis 815 of the electrode 810 by an angle 895. The angle 895 may range between 35 and 55 degrees. For example, the angle 895 is about 45 degrees in the illustrated embodiment, although in other embodiments the angle 895 may range between about 35 degrees and about 55 degrees. FIG. 9 also illustrates that the MRAM stack 805 may have a substantially elliptical perimeter, in contrast to the polygonal perimeter represented in embodiments discussed above. Of course, the MRAM stack 805 may have perimeter shapes other than the elliptical and polygonal shapes shown herein.

Thus, the present disclosure introduces a magnetic random access memory (MRAM) cell including, in one embodiment, an MRAM stack having first and second terminals and an easy axis, wherein a first conductive line is coupled to the first terminal. A second conductive line is coupled to the first terminal by a first transistor and is also coupled to the second terminal by a second transistor. A third conductive line is coupled to a first gate of the first transistor, and a fourth conductive line is coupled to a second gate of the second transistor. At least one of the first and second conductive lines is angularly offset from the MRAM stack easy axis by an angle ranging between 35 degrees and 55 degrees. In one embodiment, the offset angle is about 45 degrees.

The present disclosure also introduces an integrated circuit device comprising, in one embodiment, a plurality of magnetic random access memory (MRAM) cells each including first and second terminals and an easy axis. A first conductive line is coupled to first terminals of ones of the plurality of MRAM cells. A second conductive line is coupled to first terminals of ones of the plurality of MRAM cells by ones of a plurality of first transistors. The second conductive line is also coupled to second terminals of ones of the plurality of MRAM cells by ones of a plurality of second transistors. A third conductive line is coupled to first gates of ones of the plurality of first transistors. A fourth conductive line is coupled to second gates of ones of the plurality of second transistors. At least one of the first and second fourth conductive lines is angularly offset from the MRAM stack easy axis by an angle ranging between 35 degrees and 55 degrees.

One embodiment of an MRAM cell introduced in the present disclosure includes an MRAM stack and a conductive line for carrying write current associated with the MRAM cell in a direction that is angularly offset from an easy axis of the MRAM stack by an acute angle. The present disclosure also provides an MRAM cell that includes: (1) an MRAM stack having an easy axis and first and second terminals; (2) an electrode adjacent the MRAM stack and configured to carry current in a direction that is angularly offset from the MRAM stack easy axis by an acute angle; (3) a first transistor coupled to the first terminal; and (4) a second transistor coupled to the second terminal, wherein only one write line drives write action for the MRAM cell.

The present disclosure also introduces a method of forming an MRAM cell, wherein only one write line drives write action for the MRAM cell, the method including forming an electrode adjacent an MRAM stack such that electrical current through the electrode is angularly offset from an easy axis of the MRAM stack by an acute angle. The method may also include forming a first transistor coupled to a first terminal of the MRAM stack, and forming a second transistor coupled to a second terminal of the MRAM stack.

Another embodiment of an integrated circuit device introduced in the present disclosure includes a plurality of magnetic random access memory (MRAM) cells each including an easy axis and an electrode, wherein electrical current through the electrode is angularly offset from the MRAM stack easy axis by an acute angle, and wherein a write action of each of the plurality of MRAM cells is driven by only one corresponding write line. A plurality of first transistors are each coupled to a first terminal of a corresponding one of the plurality of MRAM cells, and a plurality of second transistors are each coupled to a second terminal of a corresponding one of the plurality of MRAM cells.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that these and other such equivalent constructions do not depart from the spirit and scope of the present disclosure, and that they may make various changes, substitutions and alterations herein without departing from the spirit and scope of the present disclosure.

What is claimed is:

1. A magnetic random access memory (MRAM) cell, comprising:

an MRAM stack having an easy axis; and a conductive line for carrying write current associated with the MRAM cell in a direction that is angularly offset from the easy axis of the MRAM stack by an acute angle, wherein the conductive line is the only line driving write action of the MRAM cell.

2. The MRAM cell of claim 1 wherein a first transistor is coupled to a first terminal of the MRAM stack and a second transistor is coupled to a second terminal of the MRAM stack.

3. A magnetic random access memory (MRAM) cell, comprising:

an MRAM stack having an easy axis and first and second terminals;

an electrode adjacent the MRAM stack and configured to carry current in a direction that is angularly offset from the MRAM stack easy axis by an acute angle;

a first transistor coupled to the first terminal; and a second transistor coupled to the second terminal;

wherein only one write line drives write action for the MRAM cell.

4. The MRAM cell of claim 3 wherein the acute angle is between about 35 degrees and about 55 degrees.

5. The MRAM cell of claim 3 wherein the MRAM stack comprises a pinned layer, a free layer, and a tunneling barrier layer interposing the pinned and free layers.

6. The MRAM cell of claim 5 wherein the free layer comprises a plurality of layers.

7. The MRAM cell of claim 5 wherein the pinned layer comprises a plurality of layers.

8. The MRAM cell of claim 3 wherein one of the first and second terminals is coupled at least indirectly to one of a free layer and a pinned layer, wherein the other of the first and second terminals is coupled at least indirectly to the other of the free layer and the pinned layer.

9. The MRAM cell of claim 3 wherein the electrode is operable to read/write the MRAM cell by conducting the current in the angularly offset direction with respect to the MRAM stack easy axis.

10. The MRAM cell of claim 3 wherein the MRAM cell comprises a portion of a 2T1MTJ configuration.

11. The MRAM cell of claim 3 further comprising:
a first conductive line coupled to the first terminal;
a second conductive line coupled to the first terminal by the first transistor and coupled to the second terminal by the second transistor;
wherein at least one of the first and second conductive lines is angularly offset from the MRAM stack easy axis by an acute angle.

12. The MRAM cell of claim 11 wherein at least the angularly offset one of the first and second conductive lines comprises an electrically conductive bulk layer and a magnetic cladding located layer about a substantial portion of the bulk layer.

13. An integrated circuit device, comprising:
a plurality of magnetic random access memory (MRAM) cells each including an easy axis and an electrode, wherein electrical current through the electrode is angularly offset from the MRAM stack easy axis by an acute angle, and wherein a write action of each of the plurality of MRAM cells is driven by only one corresponding write line;
a plurality of first transistors each coupled to a first terminal of a corresponding one of the plurality of MRAM cells; and
a plurality of second transistors each coupled to a second terminal of a corresponding one of the plurality of MRAM cells.

14. The integrated circuit device of claim 13 wherein the acute angle is about 45 degrees.

* * * * *